US012117367B2

(12) United States Patent
Amberla et al.

(10) Patent No.: US 12,117,367 B2
(45) Date of Patent: Oct. 15, 2024

(54) ARRANGEMENT FOR TESTING VEHICLE COMPONENTS AND A METHOD FOR SETTING UP AN ARRANGEMENT FOR TESTING

(71) Applicant: PROVENTIA OY, Oulunsalo (FI)

(72) Inventors: Arno Amberla, Oulunsalo (FI); Harri Kervinen, Oulunsalo (FI); Toni Arponen, Oulunsalo (FI); Mika Lakso, Oulunsalo (FI)

(73) Assignee: PROVENTIA OY, Oulunsalo (FI)

( * ) Notice: Subject to any disclaimer, the term of this patent is extended or adjusted under 35 U.S.C. 154(b) by 901 days.

(21) Appl. No.: 15/734,373

(22) PCT Filed: Jun. 5, 2019

(86) PCT No.: PCT/FI2019/050430
§ 371 (c)(1),
(2) Date: Dec. 2, 2020

(87) PCT Pub. No.: WO2019/234299
PCT Pub. Date: Dec. 12, 2019

(65) Prior Publication Data
US 2021/0164866 A1    Jun. 3, 2021

(30) Foreign Application Priority Data
Jun. 5, 2018    (EP) .................................... 18175951

(51) Int. Cl.
*G01M 17/00*    (2006.01)
*G07C 5/08*    (2006.01)
(Continued)

(52) U.S. Cl.
CPC ............. *G01M 17/00* (2013.01); *G07C 5/085* (2013.01); *H02J 7/0032* (2013.01); *H02J 7/1446* (2013.01)

(58) Field of Classification Search
CPC ..... G01R 31/385; G01M 17/00; G07C 5/085; G07C 5/00; H01M 10/4285;
(Continued)

(56) References Cited

U.S. PATENT DOCUMENTS

| 5,574,226 A | 11/1996 | Reuther et al. |
| 6,044,696 A * | 4/2000 | Spencer-Smith ... G01M 17/007 |
| | | 73/116.06 |

(Continued)

FOREIGN PATENT DOCUMENTS

| CA | 2 961 997 | 10/2017 |
| CN | 205027624 | 2/2016 |

(Continued)

OTHER PUBLICATIONS

International Search Report for PCT/FI2019/050430, mailed Oct. 8, 2019, 5 pages.

(Continued)

*Primary Examiner* — Chi Q Nguyen
(74) *Attorney, Agent, or Firm* — Nixon & Vanderhye PC

(57) ABSTRACT

There is provided an arrangement for testing vehicle components, the arrangement including a test system and at least one test chamber for components to be tested. The arrangement includes an infra structure module including a transportable container for accommodating test system equipment, and at least two test modules that each include a transportable container including the test chamber for the vehicle components to be tested. The Infra structure module is between the test modules. The arrangement further includes a test system connection element for operatively connecting the test system equipment at the infra structure module to the test module.

20 Claims, 9 Drawing Sheets

(51) Int. Cl.
*H02J 7/00* (2006.01)
*H02J 7/14* (2006.01)

(58) Field of Classification Search
CPC .. H01M 2220/20; H02J 7/0032; H02J 7/1446; Y02T 10/92; Y02E 60/10
See application file for complete search history.

(56) References Cited

U.S. PATENT DOCUMENTS

| | | | | |
|---|---|---|---|---|
| 6,427,528 | B1* | 8/2002 | Yamakado | G01M 17/0072 |
| | | | | 73/121 |
| 7,357,394 | B2* | 4/2008 | Halverson | F41J 13/00 |
| | | | | 273/404 |
| 7,478,470 | B2* | 1/2009 | Mogck | B62D 65/18 |
| | | | | 29/430 |
| 7,967,296 | B1* | 6/2011 | Halverson | F41J 11/00 |
| | | | | 273/404 |
| 10,222,455 | B1* | 3/2019 | Stieff | G01M 17/007 |
| 11,066,971 | B1* | 7/2021 | Sharp | F01N 3/04 |
| 11,371,405 | B2* | 6/2022 | Sharp | F01N 3/035 |
| 11,624,608 | B2* | 4/2023 | Lawrence | G01B 11/2755 |
| | | | | 701/33.1 |
| 11,781,860 | B2* | 10/2023 | Lawrence | G01B 11/2755 |
| | | | | 73/1.75 |
| 2002/0189173 | A1* | 12/2002 | Staschik | F02G 1/043 |
| | | | | 52/79.1 |
| 2005/0235819 | A1* | 10/2005 | Long | F41H 7/048 |
| | | | | 89/937 |
| 2010/0107749 | A1 | 5/2010 | Gushman et al. | |
| 2012/0102929 | A1* | 5/2012 | Beissler | F01N 13/002 |
| | | | | 60/297 |
| 2013/0055587 | A1* | 3/2013 | Lacey | B65D 88/745 |
| | | | | 34/79 |
| 2014/0210413 | A1 | 7/2014 | Yoon et al. | |
| 2016/0169789 | A1* | 6/2016 | Chen | G01N 17/002 |
| | | | | 73/865.6 |
| 2017/0234591 | A1* | 8/2017 | Kandasamy | B60P 3/20 |
| | | | | 62/56 |
| 2019/0204184 | A1* | 7/2019 | Neumann | G01M 17/00 |
| 2019/0331482 | A1* | 10/2019 | Lawrence | G01B 11/2755 |
| 2020/0141724 | A1* | 5/2020 | Lawrence | G01B 11/272 |
| 2021/0270164 | A1* | 9/2021 | Sharp | B01D 46/2418 |
| 2021/0404479 | A1* | 12/2021 | Renken | F04C 28/28 |

FOREIGN PATENT DOCUMENTS

| | | |
|---|---|---|
| DE | 20 2006 018 830 | 4/2007 |
| DE | 10 2013 015 304 | 3/2015 |
| GB | 2555393 | 5/2018 |

OTHER PUBLICATIONS

Written Opinion of the ISA for PCT/FI2019/050430, mailed Oct. 8, 2019, 10 Pages.
International Preliminary Report on Patentability for PCT/FI2019/050430, dated Sep. 30, 2020, 42 pages.
Extended Search Report for EP18175951, dated Dec. 7, 2018, 10 pages.
"Scalable Battery Laboratory", Oct. 30, 2015, pp. 1-2, XP055530354.
Sennhauser, "Battery Test Bench", Annual Activity Report, 2012, Feb. 1, 2013, p. 31, XP055530311.
"Environmental Chambers for Battery Testing", Jan. 24, 2013, XP055528582, 10 pages.

* cited by examiner

ARRANGEMENT FOR TESTING VEHICLE COMPONENTS AND A METHOD FOR SETTING UP AN ARRANGEMENT FOR TESTING

This application is the U.S. national phase of International Application No. PCT/FI2019/050430 filed 5 Jun. 2019, which designated the U.S. and claims priority to EP Patent Application No. 18175951.5 filed 5 Jun. 2018, the entire contents of each of which are hereby incorporated by reference.

FIELD

The embodiments described relate to a testing arrangement for testing vehicle components, such as car batteries or electric motors. The described embodiments also relate to method of setting up an arrangement for testing vehicle components.

BACKGROUND

Manufacturers of vehicle components such as engine or battery manufacturers and car manufacturers require testing facilities for testing the vehicle components. The testing may involve testing operation and capabilities of the components under various scenarios, e.g. under different environmental conditions. The testing may involve measuring electric or other properties of the components. For that purpose, the component to be tested is disposed into a test chamber for testing.

Conventionally, testing of vehicle components such as batteries and electric motors is carried out in a special-purpose testing facilities within a manufacturing facility, for example. The testing facilities is built as an integral part of other facilities such as the manufacturing facilities. This results in costly investments, long construction times, and lack of flexibility in providing the testing capabilities and the currently known arrangements are causing larger and more costly damages in the event of fire or explosions caused by the components to be tested.

BRIEF DESCRIPTION OF THE INVENTION

An object of the present invention is to provide a testing arrangement and a method so as to solve or alleviate above mentioned problems. The objects of the invention are achieved by a test arrangement and a method which is characterized by what is stated in the independent claims. The preferred embodiments are disclosed in the dependent claims.

The invention is based on the idea of new layout introducing combination of infra structure module (s) and test modules.

An advantage of the new test arrangement and method is flexibility and scalability. Also, in case of extreme situation such as fire or explosion, the modular layout makes it possible to limit the damages caused to the test arrangement. Damages can be overcome by replacing the container-module with a new one.

BRIEF DESCRIPTION OF THE DRAWINGS

In the following the invention will be described in greater detail by means of preferred embodiments with reference to the attached drawings, in which.

DETAILED DESCRIPTION OF THE INVENTION

There is provided an arrangement 10 for testing vehicle components C. In an embodiment, the component C to be tested may be a vehicle battery (a whole battery unit or a battery sub-component such as one cell of a battery). The vehicle, whereto to component relates to, can be a car, a fork lift or other loading vehicle, for example. In an embodiment, the electric car components to be tested in the container(s) comprise electric components of an electric car or a hybrid car, the hybrid car comprising both an electric engine and a combustion engine. The hybrid car may be considered as a conventional hybrid car that cannot be recharged or a plug-in hybrid electric car that can be recharged. The electric car components may include car components of a power supply system such as a battery and/or a power generation system such as an electric motor.

Figure 8:
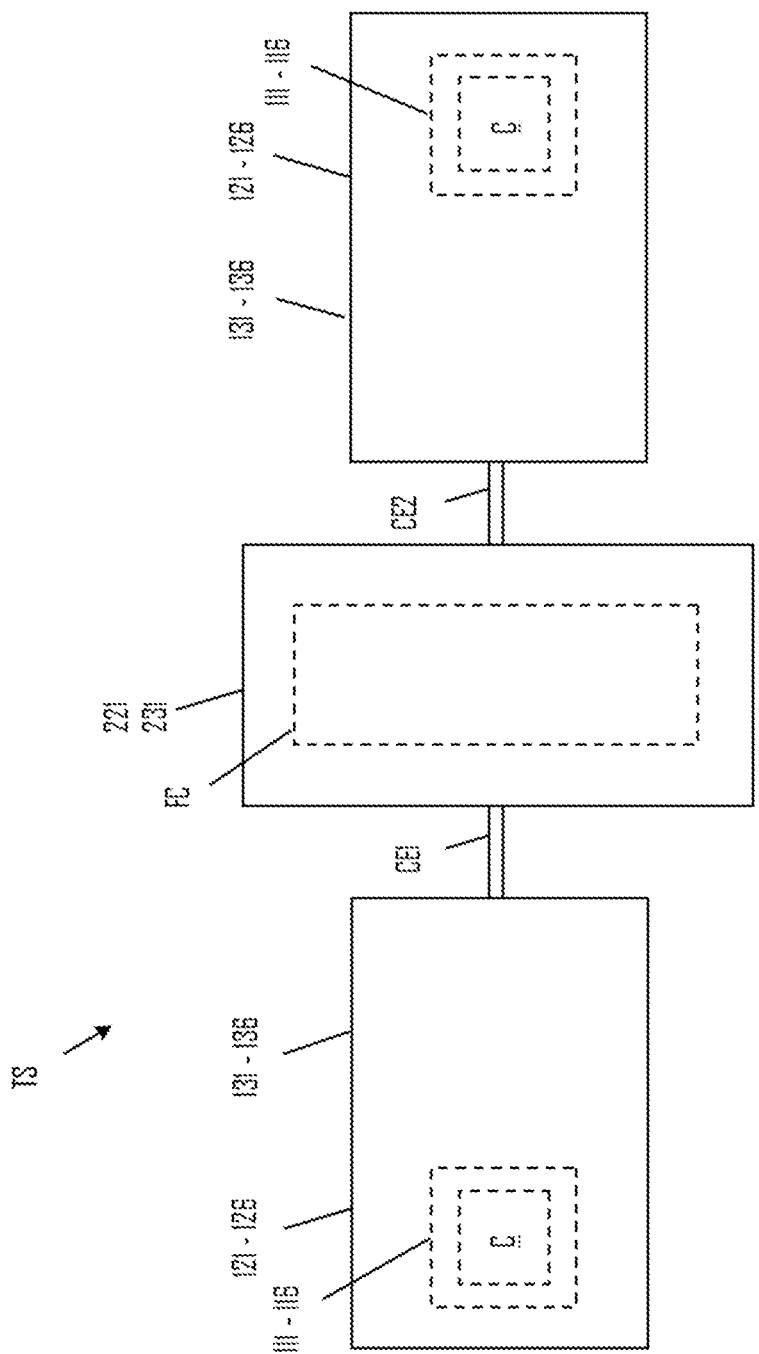
FIG. 8 is a schematic view of a test system in accordance with certain example embodiments.

As shown schematically in FIG. 8, for example, the arrangement comprises a test system TS and at least one test chamber 111-116 for components C to be tested. Six test chambers 111-116 may be provided. The arrangement comprises at least one, such as six, test modules 121-126 comprising a transportable container 131-136 comprising said test chamber 111-116 for the vehicle components C to be tested. For example, test module 121 comprises transportable container 131 comprising test chamber 111.

The arrangement comprises one or more, such as three, infra structure modules 221-223 comprising transportable containers 231-233 for accommodating test system equipment of the test system TS. In an embodiment, test system equipment may comprise frequency converter FC and the related rectifiers.

In an embodiment, the transportable containers 231-233 of the infra structure modules 221-223, are standard-size freight containers.

At least one test module, such as test module 121, is arranged next to the infra structure module such as infra structure module 221. In the shown embodiment, six test modules 121-126 are next to the infra structure module, in such way that test three modules 121-123 are next to the infra structure module 221 and other three test modules 124-126 are next to the infra structure module 223.

Figure 1:
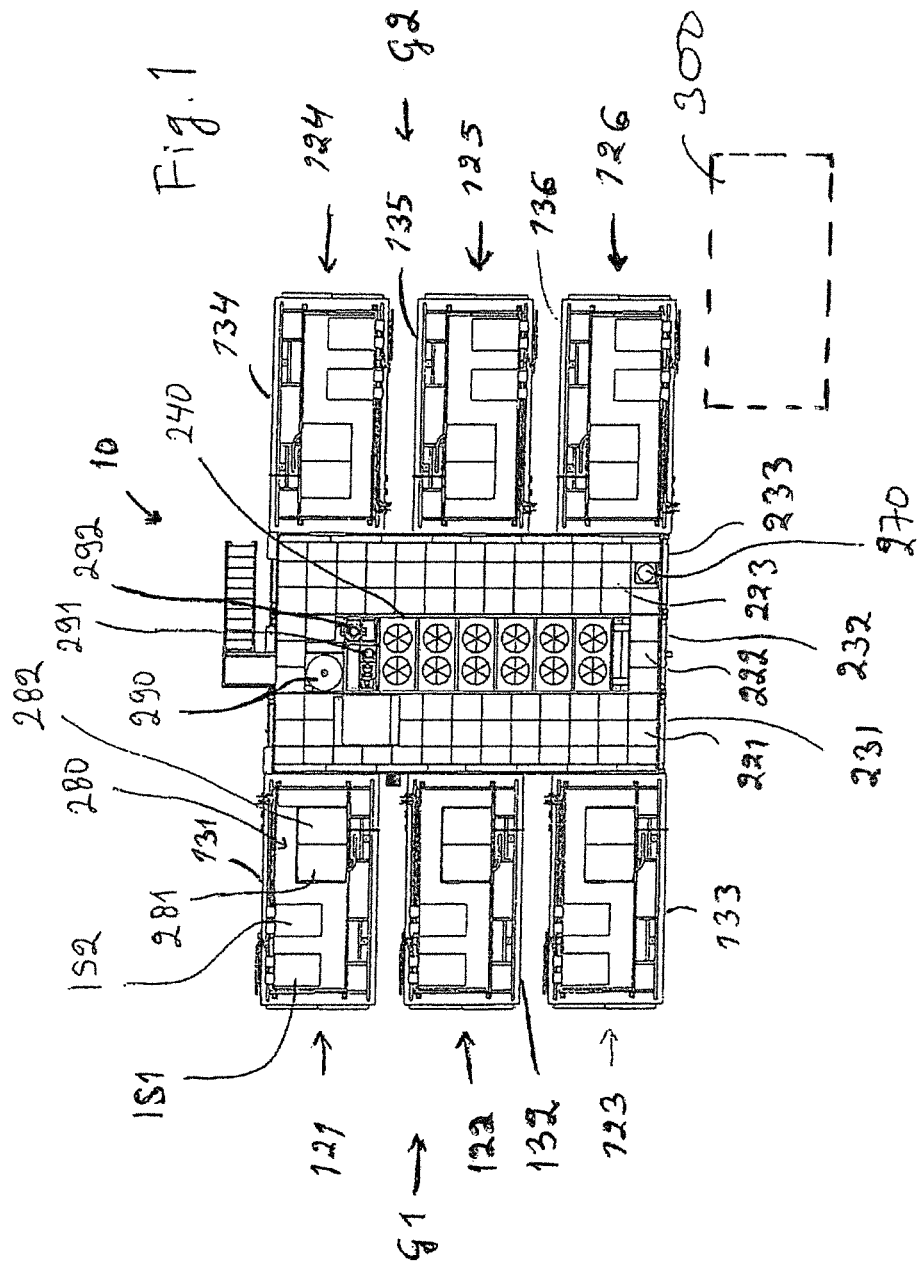
FIG. 1 is a top view layout of the test arrangement.

In an embodiment, referring to the layout, arrangement comprises two or more such as three test modules 121-123, 124-126, wherein the test modules 121-123 are on different sides of the infra structure module so that the infra structure module is between the test modules. Referring to FIG. 1, each one of the three infra structure modules 221-223 are between the test modules so that to infra structure modules 221-223 are between test modules 121-123 and 124-126.

The arrangement comprises at least two such as three infra structure modules 221-223, wherein the infra structure modules 221-223 are next to each other and between the test modules 121-123, 124-126.

Test modules 121-123 are on the left compared to the infra structure modules 221-223, and the test modules 124-126 are on the right compared to the. The right hand ends of the test modules 121-123 are next to the left hand side of the infra structure module 221, and in a corresponding way the left hand ends of the test modules 124-126 are next to the right hand side of the infra structure module 223. Infra structure module 222 is between the infra structure modules 221, 223.

In an embodiment, the test modules such as test modules 121-123 are in at least one test module group G1 wherein the test modules of the group are next to each other on the same side of the infra structure module like 221.

In an embodiment, test modules are in at least two test module groups G1, G2, wherein test modules 121-123 belong to group G1 and test modules 124-126 belong to group G2. The test modules 121-123 of the first test module group G1 are next to each other and on the one side (left) of the infra structure module 221, and wherein the test modules 124-126 of the second test module group G2 are next to each other and on a different side (right) of either the same infrastructure module or another infra structure module. If there would be only one infra structure module, the second group G2 of test modules would be on the different side of the same infra structure module. But in an embodiment, since the in the layout the test arrangement comprises more than one infra structure modules, for example three infra structure modules 221-223, then the test modules 124-126 of the second group G2 are on the different side (of another infra structure module which is the infra structure module 223. From the layout of FIG. 1, it can be seen that the principle is that one or more infra structure modules 221-223 are between the first and second group G1, G2 of test modules.

Figure 4:
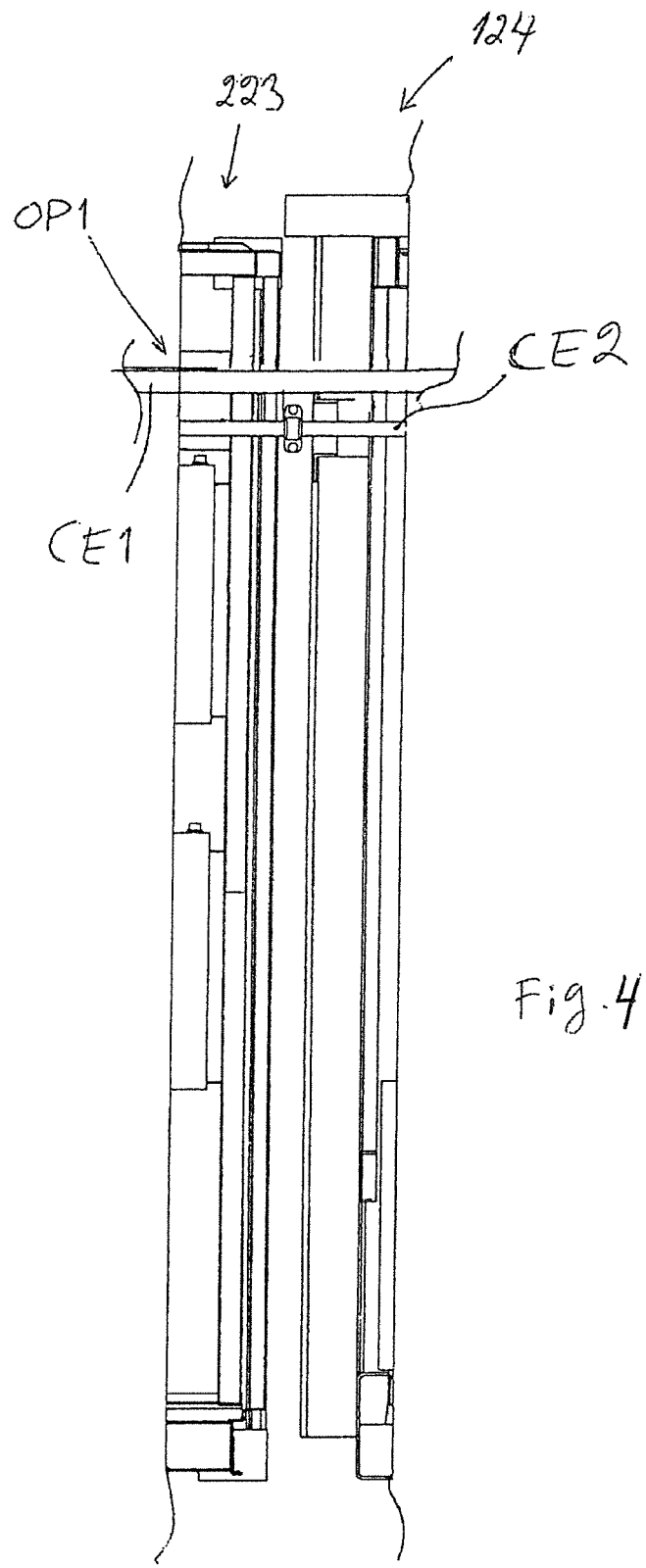
FIG. 4 shows connecting elements between the infra structure module and the test module.

Referring especially to FIG. 4, the test arrangement further comprises test system connection element CE1 for operatively connecting the test system equipment TS at the infra structure module 221 to the test module 121.

In addition to test system equipment TS, the infra structure module, such as module 222, can include additional structures and functions. In an embodiment, test the arrangement further comprises a climate control system and then the transportable container of the infra structure module 221 further accommodates at least part (such as water filtering device 250) of the climate control system, and wherein the arrangement further comprises a climate control system connection element CE2 for operatively connecting said at least part of the climate control system at the infra structure module 221 to the test module 121. Corresponding connecting elements are used also between the infra structure module 221 and test modules 122, 123 and also between the infra structure module 223 and the related test modules 124, 125, 126.

The climate control system that is at least partly accommodated at the infra structure module(s) 221-223 is for controlling climate conditions in the test chambers 111-116 at the transportable containers 131-136. The climate control system may be configured to adjust environmental conditions in the test chamber(s), like 111-116, during the testing. The climate control system may further control temperature/humidity distribution and/or air flow in the test chamber(s).

The environmental conditions controlled by the climate control system may include at least one of temperature and humidity.

Infra structure modules 221-223 can be seen as one module so module arrangement comprising three parallel sub-modules 221-223 or comprising three different modules.

Figure 2:
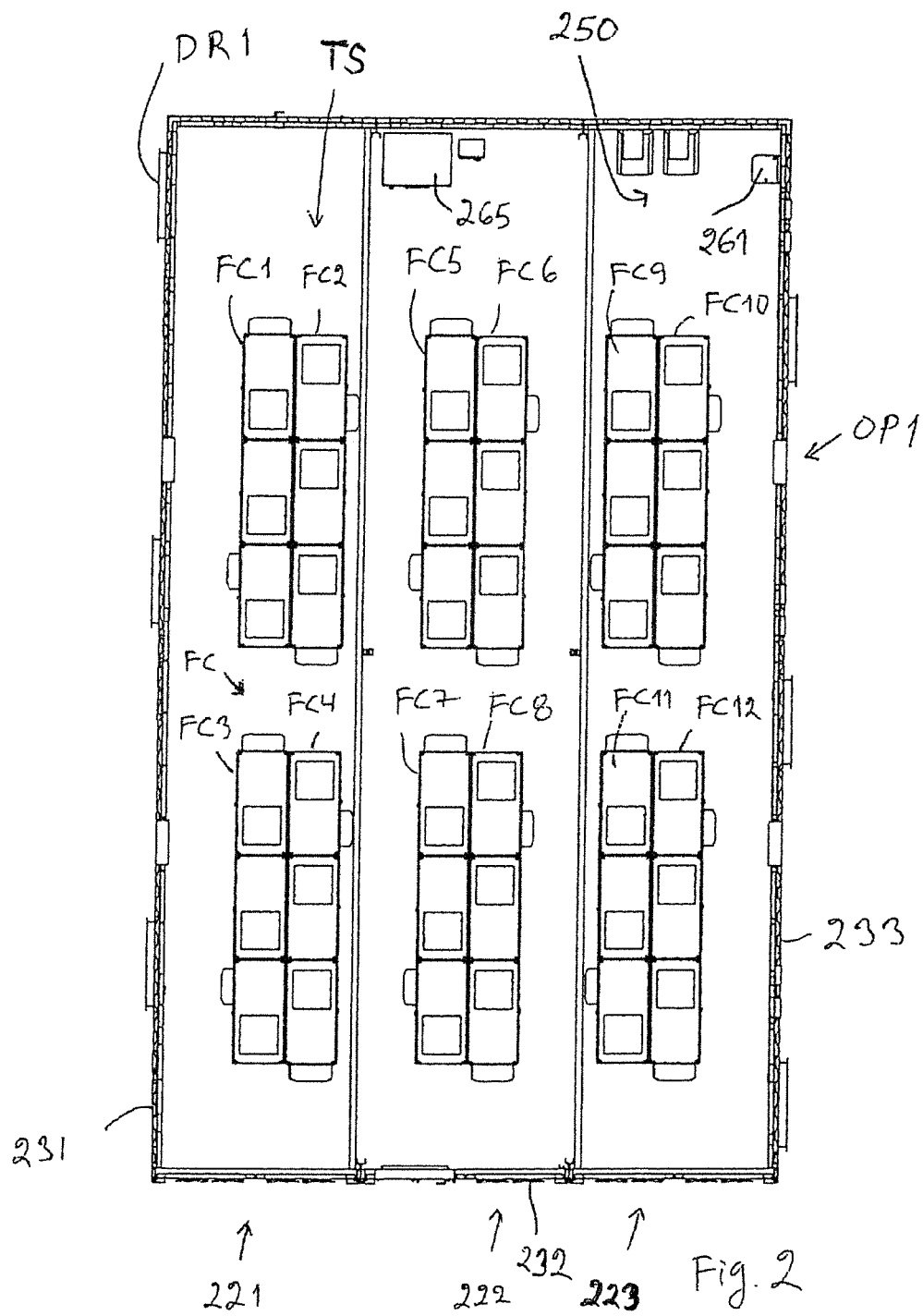
FIG. 2 shows the infra structure module.

Referring to FIGS. 1-2, regarding the those parts of the climate control system that are at the infra structure module 221-223, there is provided a water chiller 240 and it is supported on top of the infra structure module 222 so on the roof of the transportable container, like 232 of the infra structure module 222. In the embodiment of FIG. 1, the water chiller/cooler 240 has six dual elements. In FIG. 1, also on top of the roof of container 232 of the infra structure module 222 there is also provided a reservoir 290 for water and one or more pumps 291-292 for the cooling water. The cool water from water chiller 240 is used for cooling of the frequency converter/battery cycler FC, FC1-FC12 that is inside the transportable containers 231-233 of the infra structure modules 221-223.

In an embodiment, one or more parts 240, 250, 290, 291-292 of the climate control system is supported on top of the transportable container 232 of the infra structure module 222, and one or more other parts 280, 281, 282 of the of the climate control system is supported on top of the transportable container 131 of the test module 121. In an embodiment, one or more of the following is supported on top of the transportable container 232 of the infra structure module 222: water chiller 240, water filtering device 250, reservoir 290 for water, pumps 291-292 for water, and one or more of the following is supported on top of the transportable container 131 of the test module 121: outdoors unit 280 of the climate control system, compressor 281 of the outdoors unit 280 of the climate control system, cooling cell 282 of the outdoors unit 280 of the climate control system.

In FIG. 2, FC1-FC12 refers that at infra structure module 221-223, there are 12 battery cycler elements FC1-FC12 for six test modules 121-126. Each two battery cycler elements, like battery cycler elements FC1-FC2 are assembled their back walls against each other, each set of two battery cycler elements are servicing their dedicated test module.

Figure 3:
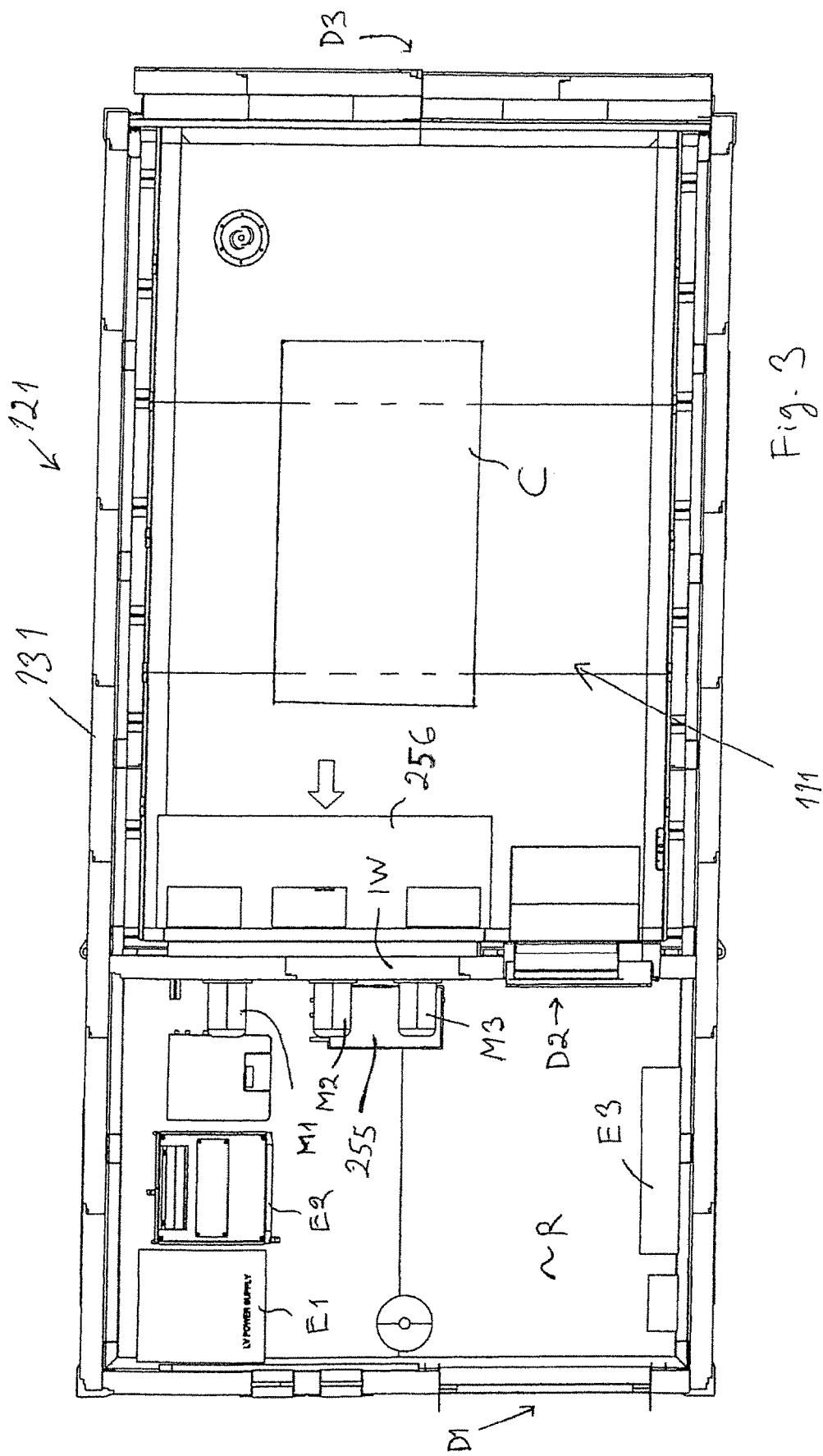
FIG. 3 shows the test module structures inside the container.

Additionally, regarding parts of the climate control system, at the infra structure module(s) 221-223 inside the transportable container, like container 231-233, there is provided a water filtering device 250 such as demineralization device 250. The role of the demineralization device 250 at the infra structure module is to produce filtered water via connecting element CE2 for the humidifier 255 that is at the test module like at the test module 121 as shown in FIG. 3.

Regarding parts at the test module, like test module 121, also the test module comprises some parts regarding the climate control system. Those parts so the climate control arrangement at the test module, like test module 121, comprises outdoor unit 280, humidifier 255 so a steam generator 255 and an internal unit 256. Outdoor unit 280 is operatively connected to humidifier 255 so steam generator, which in turn is operatively connected to the internal unit 256.

Outdoor unit 280 is on top the container 131 of the test module 121 and comprises compressor 281 for cooling and a honeycomb-type cooling cell 282. Humidifier 255 so steam generator 255 is preferably inside the test module container 131, preferably inside so at the control room R which can also be called a device room R. Internal unit 256 is at the test chamber 111 and the role of the internal unknit 256 is to circulate the air inside the test chamber 111, and for that purpose the fan motors M1-M3 are used. Humidifier 255 so steam generator 255 and the internal unit 256 are at the opposite sides of the internal wall IW between the test chamber 111 and the control room R so device room R. Cool air for the testing chamber 111 is produced by the compressor 281 and the cooling cell 282. Hot air for test chamber 111 is produced at the internal unit 256 with heating element such as a heating resistor.

In addition to outdoor unit 280, on top of the test module 121, there can be electrical isolators IS1, IS2.

Regarding FIG. 2 and relating also to FIGS. 4 and 1, the infra structure module 221, 223 comprise bushings/openings like OP1, for bringing connecting elements like CE1, CE2 from the infra structure module 221, 223 to test modules 121-126. Additionally, the infra structure module comprises doors like DR1 so as to close the pathways like pathway D1 at the test module 121.

Regarding FIGS. 1 and 3, humidifier 255 is at the control room R of the test module 121 so inside the transportable container 131 of the test module 121. The humidifier 255 such as steam generator device is connected to internal unit 256 within the test chamber 111 for delivering the humidity (water vapour/steam) to the test chamber 111. Humidifier 255 and internal unit 256 are those parts of the climate control systems that are accommodated by the test module 121.

Referring to FIG. 2, the internal wall IW divides test module 121 to a test chamber 111 and to a control/device room R. D1 refers to a pathway D1 to be closed with a door that is at the nearby infra structure module. D2 refers to door between control room R and the test chamber 111. D3 refers to door at the end of the test chamber 111. Control room R so device room may also comprise additional elements such as electrical cabinet E1, automation system cabinet E2 and switching box E3 for the battery to be tested at the test chamber 111.

As an alternative to above discussed location (at the control room R) of the humidifier 255, the humidifier 255 so the steam generator 255 can be at the outdoors unit 280, especially when the test arrangement is not subjected to cold outdoors temperature.

Connecting element CE1 between the test system at the infra structure module 211 and the test module 121 may comprise one or more electrical cables. Connecting element CE2 between the part of the climate control system at infra structure module 231 and the test module 121 may comprise one or more tubes for delivering water from infra structure module 231 to test module 121, for example for delivering filtered water from water filtering device 250 at the infra structure module 233 to the humidifier 255 at the test module 121.

In an embodiment, the transportable container of the infra structure module further accommodates one or more of the following: fire safety system, building automation system, infra structural support system.

Referring to FIG. 2, regarding fire safety system, one or more pump 261 is accommodated by the infra structure module, like module (sub-module) 223 inside the transportable container 233. Referring to FIG. 1, regarding infra structural support system, the transportable container 233 of the infra structure module (sub-module) 223 accommodates a ventilation machine 270 on top of container 233 of the infra structure module (sub-module) 223. Referring to FIG. 2, a building automation system (BAS) element 265 is inside the container 232 of the infra structure module 222.

Referring to FIG. 4, in an embodiment the arrangement may comprise release element for releasing the test system connection element CE1, for facilitating moving away of the infra structure module and/or the test module. Additionally, in an embodiment, the arrangement may comprise release element for releasing the climate control system connection element CE2, for facilitating moving away of the infra structure module and/or the test module. Release elements make it easier to have one move the test module and or infra structure module in the event of fire or explosion.

Referring to FIG. 1, in an embodiment, the arrangement further comprises a power bank module 300, said power bank module 300 being arranged for balancing the electrical transfer in relation to external power network and/or for providing a power resource in the event of external power network shut-down. Power bank may replace one test module, such as test module 126 in FIG. 1.

In an embodiment, the power bank module 300 comprises a transportable container 331 which in an embodiment transportable container of the power bank module is a standard-size freight container.

In an embodiment, the vehicle component C to be tested is a vehicle battery, and wherein the test system at the infra structure module is arranged to input charge cycles and/or discharge cycles to the vehicle battery at the test module. In a further specified embodiment the test system at the infra structure module is arranged to guide (arranged to control) a loaded battery at a test module, like test module 121, to discharge the load thereof to be used for loading another battery at another test module like test module 122. For the above mentioned purposes, the infra structure module comprises a frequency converter FC (battery cycler, FC1-FC12) and the related rectifiers inside the transportable containers 231-233 of the infra structure modules 221-223.

In an embodiment, the frequency converter may be water cooled Unico Ltd. Battery simulator (battery cycler) with 1100V voltage and 700 A electric current settings.

The transportable container of the infra structure module comprises a door DD arranged to provide access to the internal space of the infra structure module from exterior of the transportable container of the infra structure module.

Figure 5:
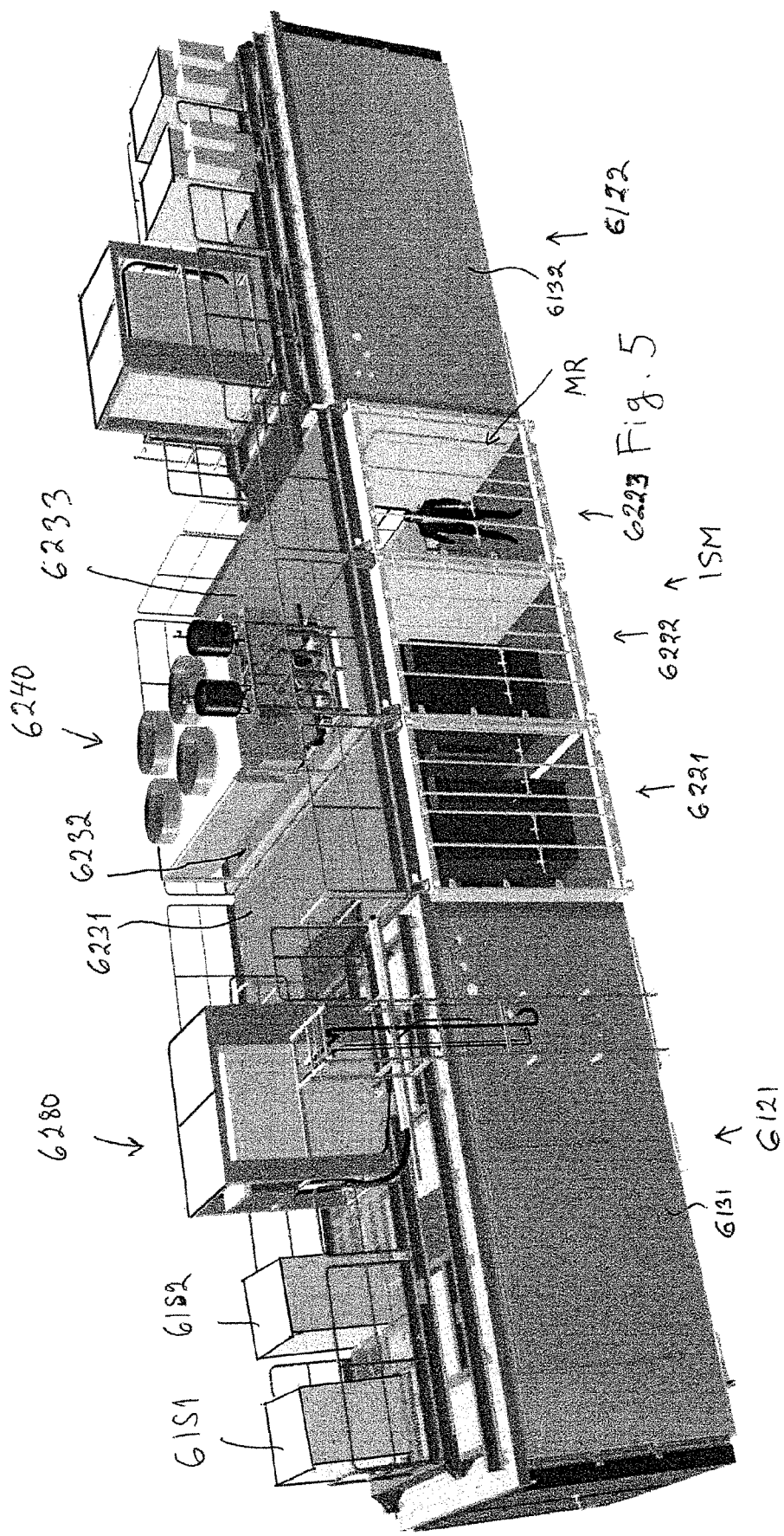
FIG. 5 shows the second embodiment of the test arrangement, having a monitoring room at the infra structure module.
Figure 6:
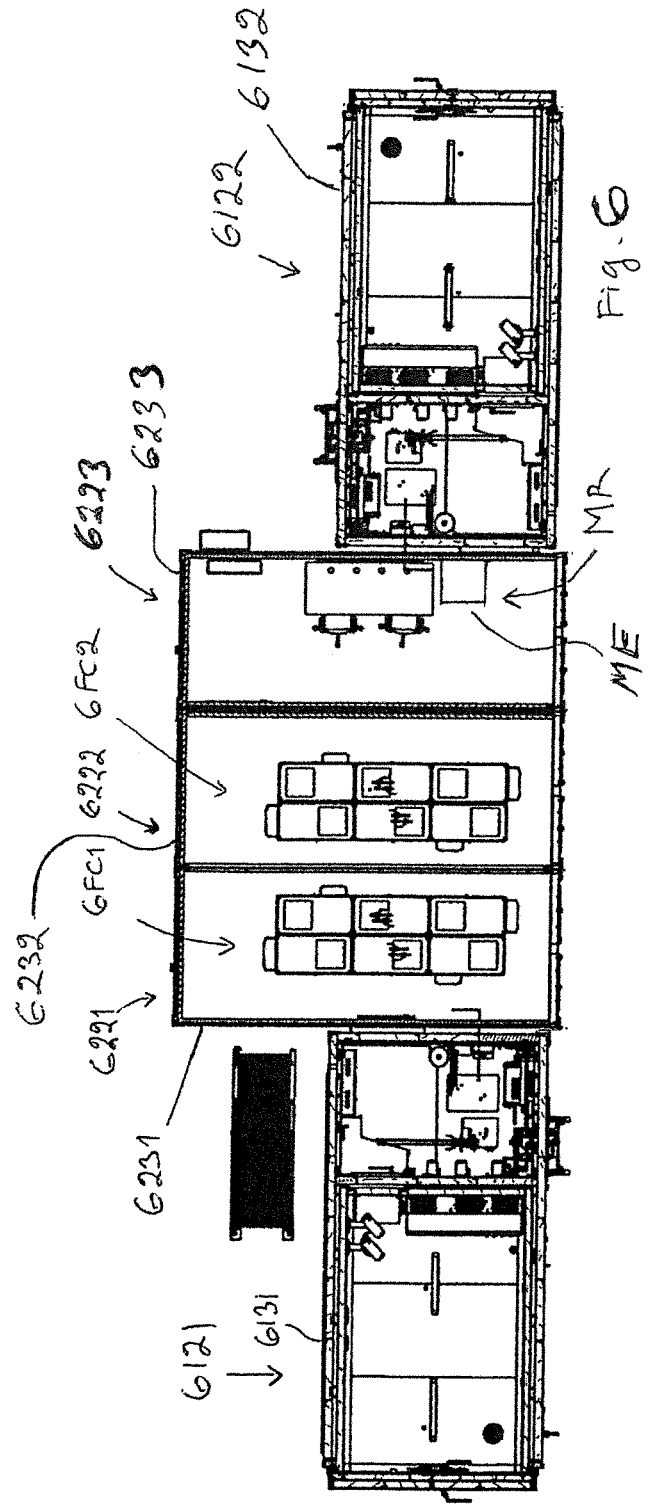
FIG. 6 shows a top view of the test arrangement of FIG. 5.

Referring to FIGS. 5-6, most of the elements in the second embodiment are similar than as discussed regarding FIGS. 1-4. Therefore in FIGS. 5-6 the test arrangement comprises infrastructure module ISM having sub-modules 6221-6223 having transportable containers 6231-6233. Furthermore, the test arrangement comprises test modules 6121-6122 having transportable containers 6231-6232. The major difference, compared to FIGS. 1-3, is that in FIGS. 5-7 the arrangement comprises a monitoring room MR (control room) in the transportable container of the infra structure module. In FIGS. 1-3 the corresponding element (control room R) is within a test module. Alternatively, monitoring room (control room) could be in a separate monitoring module that is a transportable container.

Figure 7:
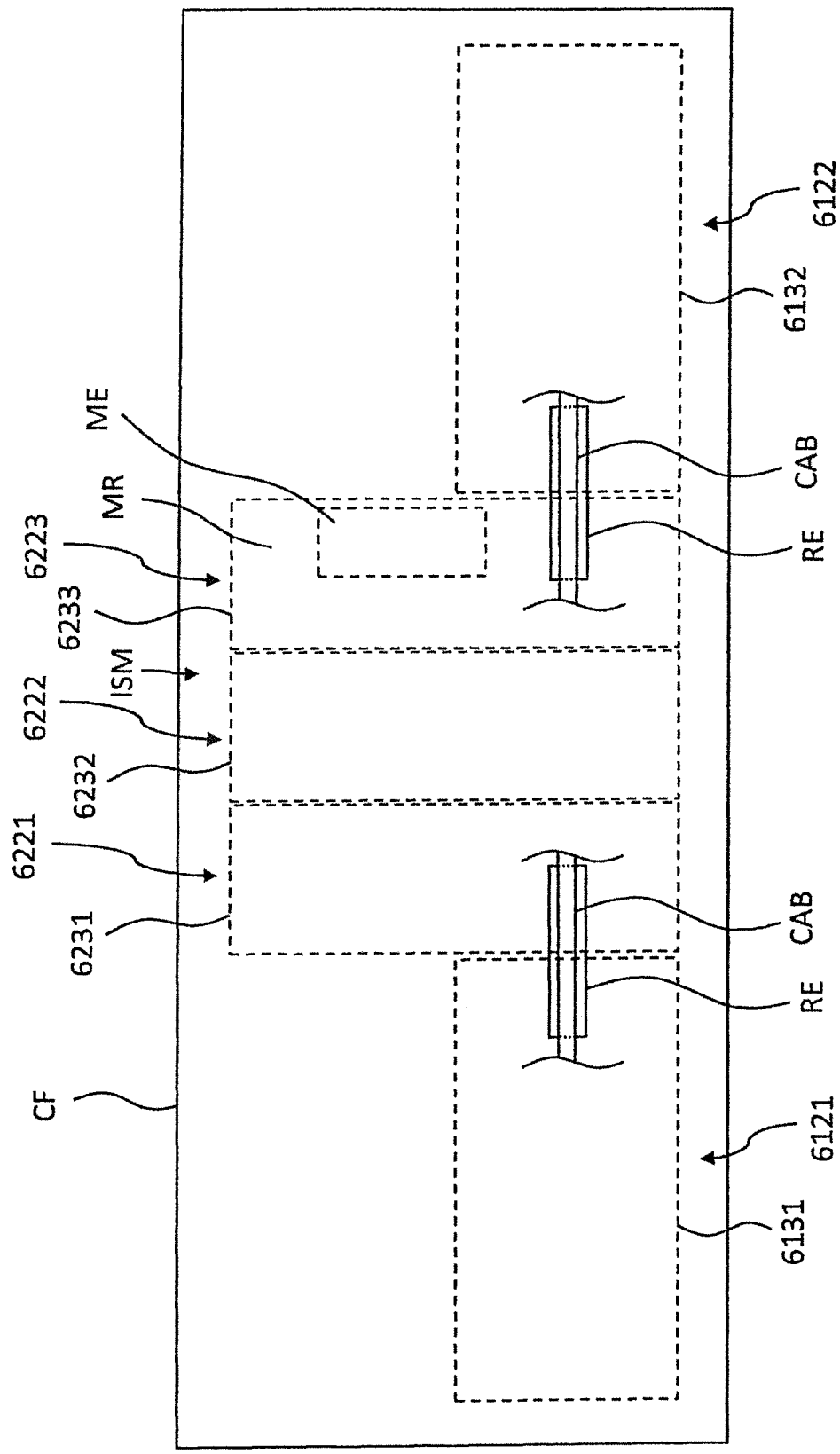
FIG. 7 shows a top view of the arrangement having concrete foundation that is supporting the modules.

Referring to FIGS. 5-7, supported on top (roof) of the container of the test module 6121, there is an outdoors unit 6280 (like 280 in FIGS. 1-3) of the the climate control system, having compressor (like compressor 281 in FIGS. 1-3) and a cooling cell (like cooling cell 282 in FIGS. 1-3). In addition to outdoors unit 6280, on top of the test module 6121, there can be electrical isolators 6IS1, 6IS2. However, in some embodiments the electrical isolators can alternatively be on top of the infra structure module(s).

Referring to FIGS. 5-6, likewise as was discussed referring to in FIGS. 1-3, supported on top (roof) infrastructure module, there are elements of the climate control system. Those elements comprise water chiller 6240 (like water chiller 240 in FIGS. 1-3), water filtering device (like device 250 in FIGS. 1-3), reservoir (like reservoir 290 in FIGS. 1-3) for water, pumps (like pumps 291-292 in FIGS. 1-3) for water.

Referring to FIGS. 5-6, in an embodiment, the monitoring room MR comprises monitoring equipment ME for receiving test data and or other data from the test module and/or from the infra structure module. The monitoring to equipment ME comprises elements like test Automation cabinet, test automation PC (computer), building automation system cabinet, Fire detection system central unit, as were discussed relating to FIGS. 1-3.

Referring to FIG. 7, in an embodiment, the arrangement comprises a concrete foundation CF for supporting one or more infra structure module 6221-6223 and the two or more test modules 6121-6122. In a further embodiment, the concrete foundation CF comprises one or more recesses RE for accommodating one or more test system connection element CAB or other cable between the modules of the arrangement.

The invention relates also to a method for for setting up (method for building) an arrangement for testing vehicle components. The method comprises the following steps:

Forming a concrete foundation CF on ground outdoors. This can be done in well known traditional way.

Supporting on the concrete foundation an infra structure module ISM, 6221-6223 comprising a transportable containers 6231-6233 for accommodating test system equipment 6FC1, 6FC2 (in containers 6231-6232, because third container 6233 of the infra structure module is the container for the monitoring room MR.

Supporting on the concrete foundation two or more test modules 6121-6122 in such way that the test modules are next to the infra structure module 6231-6233 on different sides of the infra structure module so that the infra structure module is between the test modules, each test module 6121-6122 comprising a transportable container 6131-6132 comprising the test chamber for the vehicle components to be tested.

Using test system connection elements CAB (CE1) for operatively connecting the test system equipment 6FC1, 6FC2 (FC, FC1-FC12 in FIGS. 1-3) at the infra structure module ISM to the test modules 6121-6122 (121-126 in FIGS. 1-3).

In the method, a suitable movable lifting vehicle is used for lifting and placing the modules on the concrete foundation CF.

Before supporting the infra structure module ISM, 6221-6223 and the test modules 6121-6122 on the concrete foundation CF, the test system connection elements CAB or other cables between the modules of the arrangement are laid on the recesses RE on the top surface of the concrete foundation CF.

Regarding the elements of the climate control system, the connection is established between those elements on top the infra structure module and those elements on top of the test modules. This can be done with suitable tubes and cables or other connecting elements.

Figure 9:
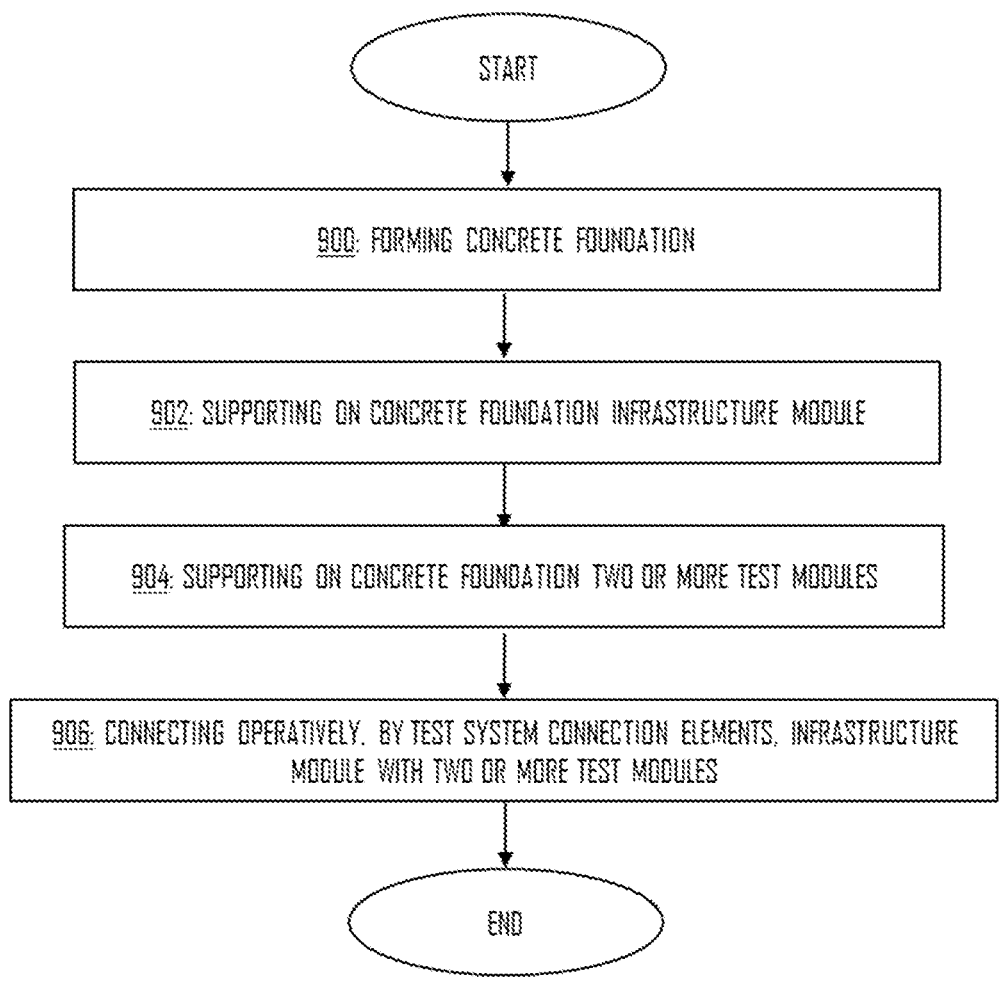
FIG. 9 is a flowchart showing a method in accordance with certain example embodiments.

FIG. 9 is a flowchart showing a method in accordance with certain example embodiments. As shown, the method includes forming a concrete foundation (step 900); supporting on the concrete foundation the infra structure module (step 902); supporting on the concrete foundation two or more text modules (step 904); and operatively connecting, by test system connection elements, the infra structure module with two or more test modules.

It will be obvious to a person skilled in the art that, as the technology advances, the inventive concept can be implemented in various ways. The invention and its embodiments are not limited to the examples described above but may vary within the scope of the claims.

The invention claimed is:

1. An arrangement for testing vehicle components, comprising:
   a test system,
   a first infra structure module comprising a first transportable container for accommodating test system equipment, and
   two or more test modules, each said test module comprising a respective second transportable container, each said second transportable container comprising a respective test chamber, the test chambers being structured to house the vehicle components to be tested, the test modules being next to the first infra structure module, the second transportable containers being structurally separate, and separated, from one another, and
   a test system connection element for operatively connecting the test system equipment at the first infra structure module to the test modules.

2. The arrangement according to claim 1, further comprising:
   a climate control system, the first transportable container further accommodating at least part of the climate control system, and
   a climate control system connection element configured to operatively connect said at least part of the climate control system at the first infra structure module to the test modules.

3. The arrangement according to claim 2, wherein the first transportable container further accommodates a fire safety system, a building automation system, and/or an infra structural support system.

4. The arrangement according to claim 2, wherein one or more parts of the climate control system is/are supported on top of the first transportable container of the first infra structure module, and one or more other parts of the of the climate control system is/are supported on top of at least one of the second transportable containers.

5. The arrangement according to claim 4, wherein a top of the first transportable container supports: a water chiller, a water filtering device, a reservoir for water, and/or pumps for water,
   wherein a top of at least one second transportable container supports: an outdoors unit of the climate control system, a compressor of the outdoors unit of the climate control system, and/or a cooling cell of the outdoors unit of the climate control system.

6. The arrangement of claim 2, further comprising a release element configured to release the climate control system connection element, and to facilitate movement of the first infra structure module and/or the test modules away from the arrangement.

7. The arrangement according to claim 1, further comprising a second infra structure module, the first and second infra structure modules being next to each other and being between the test modules.

8. The arrangement according to claim 1, wherein the test modules are organized in at least first and second test module groups,
   wherein the test modules of the first test module group are next to each other and on one side of the first infra structure module, and wherein the test modules of the second test module group are next to each other, and on a different side of either the first infra structure module or another infra structure module.

9. The arrangement according to claim 8, wherein each infra structure module is between the first and second groups of test modules.

10. The arrangement according to claim 1, further comprising a release element configured to release the test system connection element, and to facilitate movement of the first infra structure module and/or the test modules away from the arrangement.

11. The arrangement according to claim 1, being configured to test a vehicle battery provided in a first one of the test modules, wherein the test system at the first infra structure module is arranged to input charge cycles and discharge cycles to the vehicle battery at the first test module.

12. The arrangement according to claim 11, wherein the test system at the first infra structure module is arranged to guide a loaded battery at the first test module to discharge the load thereof to be used for loading another battery at another one of the test modules.

13. The arrangement according to claim 1, further comprising a power bank module, said power bank module being arranged to balance electrical transfer in relation to an external power network and/or to provide a power resource in an event of external power network shut-down.

14. The arrangement according to claim 1, wherein the first transportable container is a freight container.

15. The arrangement according to claim 1, further comprising a monitoring room in the first transportable container or in a separate monitoring module that is a third transportable container,
wherein the monitoring room comprises monitoring equipment configured to receive data from at least one of the test modules and the first infra structure module.

16. The arrangement according to claim 1, further comprising a concrete foundation structured to support at least the first infra structure module and the test modules.

17. The arrangement according to claim 16, wherein the concrete foundation comprises one or more recesses configured to accommodate one or more test system connection elements or at least one cable between the modules of the arrangement.

18. The arrangement according to claim 1, wherein the test modules are next to the first infra structure module on different sides of the first infra structure module so that the first infra structure module is between the test modules.

19. A method for setting up an arrangement for testing vehicle components, the method comprising:
forming a concrete foundation,
supporting, on the concrete foundation, an infra structure module comprising a first transportable container for accommodating test system equipment,
supporting, on the concrete foundation, two or more test modules, the test modules being positioned next to the infra structure module on different sides thereof so that the infra structure module is between the test modules, each said test module comprising a respective second transportable container, each said second transportable container comprising a test chamber for accommodating the vehicle components to be tested, the second transportable containers being structurally separate, and separated, from one another, and
operatively connecting the test system equipment at the infra structure module to the test modules using test system connection elements.

20. The method according to claim 19, wherein before supporting the infra structure module and the test modules on the concrete foundation, the test system connection elements, or other cables between the modules of the arrangement, are laid on the recesses on a top surface of the concrete foundation.

* * * * *